United States Patent
Zhu et al.

(10) Patent No.: US 9,697,789 B2
(45) Date of Patent: Jul. 4, 2017

(54) MULTI-PHASE CLOCK GENERATING CIRCUIT AND LIQUID CRYSTAL DISPLAY PANEL

(71) Applicant: SHENZHEN CHINA STAR OPTOELECTRONICS TECHNOLOGY CO., LTD., Guangdong (CN)

(72) Inventors: Jiang Zhu, Guangdong (CN); Dongsheng Guo, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 182 days.

(21) Appl. No.: 14/770,511

(22) PCT Filed: Jun. 1, 2015

(86) PCT No.: PCT/CN2015/080468
§ 371 (c)(1),
(2) Date: Aug. 26, 2015

(87) PCT Pub. No.: WO2016/187893
PCT Pub. Date: Dec. 1, 2016

(65) Prior Publication Data
US 2017/0140726 A1    May 18, 2017

(30) Foreign Application Priority Data

May 27, 2015 (CN) .......................... 2015 1 0280398

(51) Int. Cl.
G09G 3/36 (2006.01)
G02F 1/1362 (2006.01)
G02F 1/1368 (2006.01)
G11C 19/28 (2006.01)

(52) U.S. Cl.
CPC ......... *G09G 3/3677* (2013.01); *G02F 1/1368* (2013.01); *G02F 1/136286* (2013.01); *G11C 19/287* (2013.01); *G09G 2310/0286* (2013.01); *G09G 2310/08* (2013.01)

(58) Field of Classification Search
CPC .............. G09G 3/3674; G09G 3/3677; G09G 2310/0286; G11C 27/04
See application file for complete search history.

(56) References Cited

U.S. PATENT DOCUMENTS 3,641,363 A * 2/1972 Krause .................. G11C 19/28
327/189
5,051,739 A * 9/1991 Hayashida ............... G09G 3/30
345/206

(Continued)

*Primary Examiner* — Gene W Lee
(74) *Attorney, Agent, or Firm* — Osha Liang LLP

(57) ABSTRACT

The present invention provides a multi-phase clock generating circuit and liquid crystal display panel, said circuit comprising: a shift register including N shift registration units, which are cascaded with each other; a first output terminal of nth shift registration units connected to a first input terminal of an (n+1)th shift registration unit; a thin film transistor set including N thin film transistors, said control terminals of said thin film transistors of a nth stage are respectively connected to said first output terminals of (N−n+1) shift registration units.

15 Claims, 2 Drawing Sheets

(56) References Cited

U.S. PATENT DOCUMENTS

| | | | |
|---|---|---|---|
| 2007/0195920 A1* | 8/2007 | Tobita | G11C 19/28 |
| | | | 377/64 |
| 2016/0253977 A1* | 9/2016 | Ohkawa | G09G 3/3677 |
| | | | 345/213 |

* cited by examiner

MULTI-PHASE CLOCK GENERATING CIRCUIT AND LIQUID CRYSTAL DISPLAY PANEL

BACKGROUND OF THE INVENTION

Field of the Invention

The present invention relates to the field of displays, and in particular to a multi-phase clock generating circuit and liquid crystal display panel.

Description of the Related Art

LCD TVs are widely used due to characteristics such as small size, low weight, low power consumption, and high resolution.

An LCD panel drive circuit generally includes a timing control chip, a line scan drive chip, etc. The line scan drive chip is located at the side of LCD panel to achieve the purpose of saving resources, but in order to achieve a better visual effect, the line scan drive chip is often required to provide multi-channel clock signals, and there is a certain phase difference between the clock signals.

FIG. 1 illustrates a connection diagram of a conventional timing controller chip and a multi-phase clock generating circuit connection diagram. Since a timing controller chip 10 is inputted with multi-channel clock signals CLK1-CLKn to a multiple phase clock generating circuit 11, the multi-phase clock generating circuit 11 then outputs multi-channel clock signals CLK1-CLKn to a line scan drive chip 12. Because of the need for outputting multi-channel clock signals, the number of pins of the timing controller chip 10 and the line scan drive chip 12 is increased, while the cost of the drive circuit is increased as well.

Therefore, there is a need for a multi-phase clock generating circuit and liquid crystal display panel to solve the problems of the prior art.

SUMMARY OF THE INVENTION

The purpose of the present invention is to provide a multi-phase clock generating circuit and an LCD panel to solve the technical problems that the conventional timing controller chip needs to have output pins corresponding to the multi-channel clock signals, which increases production cost.

To solve the above problem, the present invention manufactures a multi-phase clock generating circuit, the multi-phase clock generating circuit comprises:

a shift register including N shift registration units, which are cascaded with each other; each shift registration unit having a first input terminal, a second input terminal, and a first output terminal, the first input terminal being inputted with an activation control signal, the activation control signal being used for controlling an activation of a shift register; the second input terminal being inputted with a delay control signal, a delay control signal for controlling outputting of the shift registration unit, the first output terminal of an nth shift registration unit connected to a first input terminal of an (n+1)th shift registration unit, wherein $N \geq 2$, $1 \leq n \leq N$; and a thin film transistor set including N thin film transistors, each of the thin film transistors corresponding to one of the shift registration units; each of the thin film transistors having a third input terminal, a control terminal, and a second output terminal; the third input terminal of each of the thin film transistor being inputted with a main clock signal, a main clock signal being used for providing a reference clock; a second clock signal output terminal of each of the thin film transistors outputting a sub-clock signal, which is inputted to the line scan drive chip of the display panel; wherein the control terminals of the thin film transistors of the nth stage are respectively connected to the first output terminals of the (N−n+1) shift registration units;

a first diode set including N first diodes, each of the first diodes corresponding to each of the shift registration units; an anode of the first diode connected to the first output terminal of the shift registration unit, a cathode of the first diode connected to the control terminal of the thin film transistor;

a second diode set including N−1 second diodes, each two adjacent shift registration units being connected to each other through the second diode; cathode of the nth second diode connected to cathode of the first diode of the nth shift registration unit, an anode of the nth second diode connected to a cathode of the first diode of the (n+1)th shift registration unit;

wherein the phase difference between an nth sub-clock signal and an (n+1)th sub-clock is determined according to a period of the delay control signal.

In the multi-phase clock generating circuit of the present invention, an output time of a high voltage level of an activation control signal determines an output time of multi-channel sub-clock signals.

In the multi-phase clock generating circuit of the present invention, the first output terminal of the Nth shift registration unit is connected to the first input terminal of the 1st shift bit storage through a third diode, an anode of the third diode is connected to the first output terminal of the Nth shift registration unit; a cathode of the third diode is connected to the first input terminal of the 1st shift registration unit.

To solve the above problem, the present invention manufactures a multi-phase clock generating circuit, the multi-phase clock generating circuit comprises:

a shift register including N shift registration units, which are cascaded with each other; each shift registration unit having a first input terminal, a second input terminal, and a first output terminal, the first input terminal being inputted with an activation control signal, the activation control signal being used for controlling an activation of a shift register; the second input terminal being inputted with a delay control signal, the delay control signal for controlling outputting of the shift registration unit, the first output terminal of an nth shift registration unit connected to the first input terminal of an (n+1)th shift registration unit, wherein $N \geq 2$, $1 \leq n \leq N$; and a thin film transistor set including N thin film transistors, each of the thin film transistors corresponding to one of the shift registration units; each of the thin film transistors having a third input terminal, a control terminal, and a second output terminal; a third input terminal of each of the thin film transistors being inputted with a main clock signal serving as a reference clock; a second clock signal output terminal of each of the thin film transistors outputting a sub-clock signal, which is inputted to line scan drive chip of the display panel; wherein the control terminals of the thin film transistors of a nth stage are respectively connected to the first output terminals of (N−n+1) shift registration units.

In the multi-phase clock generating circuit of the present invention, the multi-phase clock generating circuit further comprises:

a first diode set including N first diodes, each of the first diodes corresponding to each of the shift registration units;

an anode of the first diode connected to the first output terminal of the shift registration unit, a cathode of the first diode connected to the control terminal of the thin film transistor.

In the multi-phase clock generating circuit of the present invention, the multi-phase clock generating circuit further comprises:

a second diode set including N−1 second diodes, each two adjacent shift registration units being connected to each other through a second diode;

a cathode of the nth second diode connected to a cathode of the first diode of the nth shift registration unit, an anode of the nth second diode connected to a cathode of the first diode of the (n+1)th shift registration unit.

In the multi-phase clock generating circuit of the present invention, a phase difference between an nth sub-clock signal and an (n+1)th sub-clock is determined according to a period of the delay control signal.

In the multi-phase clock generating circuit of the present invention, an output time of a high voltage level of an activation control signal determines an output time of the multi-channel sub-clock signals.

In the multi-phase clock generating circuit of the present invention, the first output terminal of the Nth shift registration unit is connected to the first input terminal of the 1st shift bit storage through a third diode, and an anode of the third diode is connected to the first output terminal of the Nth shift registration unit; a cathode of the third diode is connected to the first input terminal of the 1st shift registration unit.

The present invention further provides a liquid crystal display panel, the liquid crystal display panel comprises:

a plurality of data lines and a plurality of scan lines, and a plurality of primitive cells limited by the data lines and the scan lines; and a line scan drive chip for providing a scanning signal to the scan lines; the scanning signal being generated according to multi-channel sub-clock signals of a multi-phase clock generating circuit;

wherein the multi-phase clock generating circuit comprises:

a shift register including N shift registration units, which are cascaded with each other; each shift registration unit having a first input terminal, a second input terminal, and a first output terminal, the first input terminal being inputted with an activation control signal, an activation control signal used for controlling an activation of a shift register; the second input terminal being inputted with a delay control signal, a delay control signal for controlling outputting of the shift registration unit, the first output terminal of an nth shift registration unit connected to the first input terminal of an (n+1)th shift registration unit, wherein N≥2, 1≤n≤N; and a thin film transistor set including N thin film transistors, each of the thin film transistors corresponding to one of the shift registration units; each of the thin film transistors having a third input terminal, a control terminal, and a second output terminal; a third input terminal of each of the thin film transistors being inputted with a main clock signal serving as a reference clock; the second clock signal output terminal of each of the thin film transistors outputting a sub-clock signal, which is inputted to a line scan drive chip of the display panel; wherein the control terminals of the thin film transistors of nth stage are respectively connected to the first output terminals of (N−n+1) shift registration units.

In the liquid crystal display panel of the present invention, the multi-phase clock generating circuit further comprises:

a first diode set including N first diodes, each of the first diodes corresponding to each of the shift registration units;

an anode of the first diode connected to the first output terminal of the shift registration unit, a cathode of the first diode connected to the control terminal of the thin film transistor.

In the liquid crystal display panel of the present invention, the multi-phase clock generating circuit further comprises:

a second diode set including N−1 second diodes, each two adjacent shift registration units being connected to each other through the second diode;

a cathode of the nth second diode connected to a cathode of the first diode of the nth shift registration unit, an anode of the nth second diode connected to a cathode of the first diode of the (n+1)th shift registration unit.

In the liquid crystal display panel of the present invention, a phase difference between an nth sub-clock signal and an (n+1)th sub-clock is determined according to a period of the delay control signal.

In the liquid crystal display panel of the present invention, an output time of a high voltage level of an activation control signal determines an output time of the multi-channel sub-clock signals.

In the liquid crystal display panel of the present invention, the first output terminal of the Nth shift registration unit is connected to the first input terminal of the 1st shift bit storage through a third diode, and an anode of the third diode is connected to the first output terminal of the Nth shift registration unit; a cathode of the third diode is connected to the first input terminal of the 1st shift registration unit.

The multi-phase clock generating circuit and liquid crystal display panel of the present invention, through improvements over the conventional clock generating circuit, makes only one-channel signal inputted generate of multi-channel clocks with phase shift, and reduces the number of pins on the timing controller chip, thereby reducing production cost.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
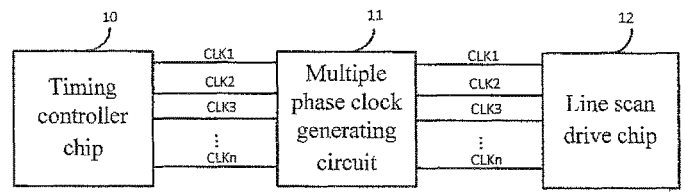
FIG. 1 is a diagram illustrating connection of a conventional timing controller chip and multi-phase clock generating circuit.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

In the drawings, the same numerals denote units with similar structures.

Figure 2:
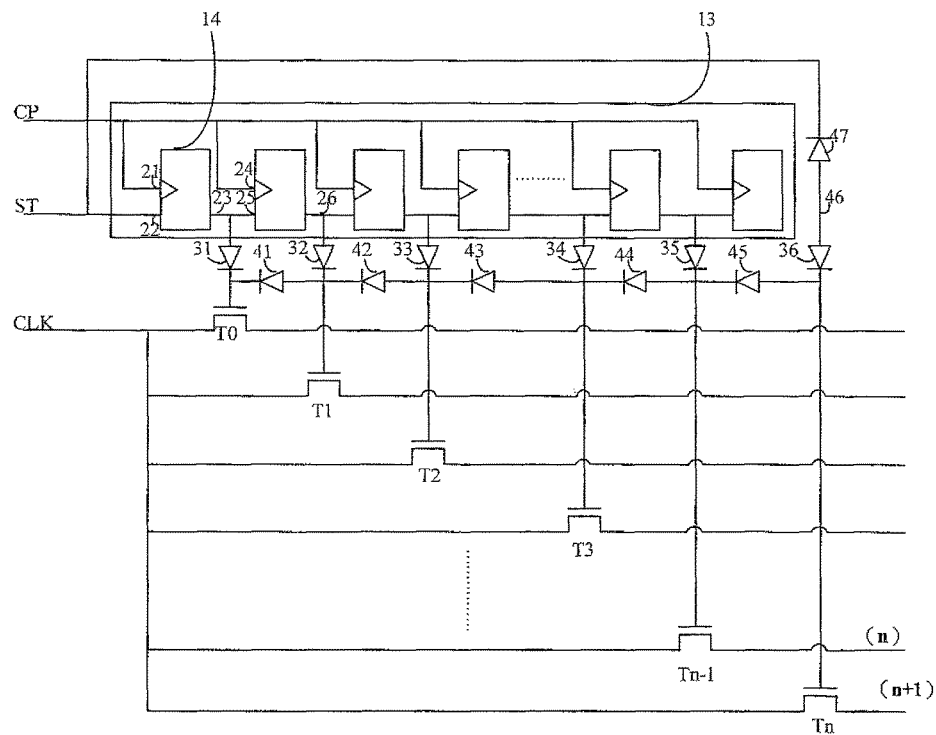
FIG. 2 is a diagram illustrating structure of a multi-phase clock generating circuit according to the present invention.

Refer to FIG. 2, which is a diagram illustrating the structure of a multi-phase clock generating circuit according to the present invention.

According to the multi-phase clock generating circuit of the present invention as shown in FIG. 1, the input signal comprises: a delay control signal CP, an activation control signal ST, and a main clock signal CLK; multi-phase clock generating circuit comprises: a shift register 13 and a thin film transistor set T0-Tn.

The shift register 13 includes N shift registration units 14, which are cascaded with each other (not limited to the order of the cascade), wherein N≥2, the shift registration units 14, for example, are triggers FF0-FFn. Each shift registration unit has a first input terminal, a second input terminal, and a first output terminal, the first input terminal is inputted with an activation control signal, the activation control signal is used for controlling an activation of a shift register; the second input terminal is inputted with a delay control signal, the delay control signal is for controlling outputting of the shift registration unit, the first output terminal of an nth shift registration unit being connected to the first input terminal of an (n+1)th shift registration unit, the shift registration unit, for example, is a trigger, wherein N≥2, 1≤n≤N.

The thin film transistor set includes N thin film transistors T0-Tn, each of the thin film transistors corresponds to each of the shift registration units; each of the thin film transistors has a third input terminal, a control terminal, and a second output terminal; a third input terminal of each of the thin film transistors is inputted with a main clock signal, the main clock signal is used for providing a reference clock; the second clock signal output terminal of each of the thin film transistors outputs a sub-clock signal, which is inputted to the line scan drive chip of the display panel; wherein the control terminals of the thin film transistors of a nth stage are respectively connected to the first output terminals of (N−n+1) shift registration units.

For example, the 1st shift registration unit FF0 has a first input terminal 22, a second input terminal 21, and a first output terminal 23. The first input terminal 22 is inputted with the activation control signal ST, the second input terminal 21 is inputted with the delay control signal CP, the first output terminal 23 of the 1st shift registration unit FF0 is connected to the first input terminal 25 of the 2nd trigger FF1; and the first output terminal 23 is also connected to a thin film transistor T0; the third input terminal of the thin film transistor T0 is connected to the main clock signal CLK, the second output terminal of the thin film transistor T0 outputs the 1st sub-clock signal CLK1; the control terminal of the thin film transistor T0 is connected to the first output terminal of the shift registration unit FF0-FFn.

The 2nd shift registration unit FF1 has a first input terminal 25, a second input terminal 24, and a first output terminal 26. The first input terminal 25 is connected to the first output terminal 23 of the 1st shift registration unit FF0; the second input terminal 24 is connected to the delay control signal CP; the first output terminal 26 is connected to the thin film transistor T1, the first output terminal 26 is also connected to the first input terminal of the 3rd shift registration unit FF2; the third input terminal of the thin film transistor T1 is connected to the main clock signal CLK, the second output terminal of the thin film transistor T1 outputs a 2nd sub-clock signal CLK2; the control terminal of the thin film transistor T1 is connected to the first output of the shift registration unit FF1-FFn.

The first output terminal of the 3rd shift registration unit FF2 is connected to the thin film transistor T2, the second output terminal of the thin film transistor T2 outputs the 3rd sub-clock signal path CLK3; the first output terminal of the 4th shift registration unit FF3 is connected to the thin film transistor T3, the second output terminal of the thin film transistor T3 outputs the 4th sub-clock signal CLK4; the first output terminal of the nth shift registration unit FFn−1 is connected to the thin film transistor Tn−1, the second output terminal of the thin film transistor Tn−1 outputs the nth sub-clock signal CLK (n); the first output terminal of the (n+1)th shift registration unit FFn is connected to the thin film transistor Tn, the second output terminal of the thin film transistor Tn outputs the (n+1)th sub-clock signal CLK (n+1); this is similar to the rest of the triggers.

When the activation control signal is high voltage level, and when the delay control signal arrives a rising edge, corresponding to the output of a shift registration unit, through the control of the delay control signal, a multi-channel sub-clock signal with phase difference is generated from the multi-stage shift registration unit. The multi-phase clock generating circuit of the present invention requires only one channel clock signal to be inputted to obtain multi-channel clock signals, thus reducing the number of the output pins of the timing control chip and the input pins of multi-phase clock generating circuit, and reducing production cost.

Preferably, the multi-phase clock generation circuit further includes a first diode set, and the first diode set includes N first diodes. As shown in 31-36 of FIG. 2, each of the first diodes corresponds to each of the shift registration units; an anode of the first diodes is connected to the first output terminal of the shift registration unit, a cathode of the first diode is connected to a control terminal of the thin film transistor.

For example, a diode 31 is set between the control terminal of the thin film transistor T0 and the first output terminal 23 of the 1st shift storage unit FF0, an anode of the first diode 31 is connected to the first output terminal 23 of the 1st shift registration unit, and a cathode of the first diode 31 is connected to the control terminal of the thin film transistor T0.

The multi-phase clock generating circuit further comprises a second diode set, and the second diode set includes N−1 second diodes. Each two adjacent shift registration units are connected to each other through the second diode; a cathode of an nth second diode is connected to a cathode of the first diode of an nth shift registration unit, an anode of an nth second diode is connected to a cathode of the first diode of an (n+1)th shift registration unit.

A first diode 41 is set between the cathode of the first diode 31 of the 1st shift registration unit FF0 and the cathode of the first diode 32 of the shift registration unit FF1, the anode of the second diode 41 is connected to the cathode of the first diode 32 of the 2nd shift registration unit FF1. A second diode 42 is set between the cathode of the first diode 32 of the 2nd shift registration unit FF1 and the cathode of the first diode 33 of the 3rd shift registration unit FF2. A second diode 44 is set between the cathode of the first diode 34 of the (n−1)th shift registration unit FF(n−2) and the cathode of the first diode 35 of the nth shift registration unit FF(n−1). A second diode 45 is set between the cathode of the first diode 35 of the nth shift registration unit FF(n−1) and the cathode of the first diode 36 of the (n+1)th shift registration unit FF(n). The remaining diodes are similar.

By setting the second diode, when the following-stage shift registration unit is triggered, the signal outputted can be passed to the control terminal of the thin film transistor which a previous-stage shift registration unit or several previous-stage shift registration units corresponds through the second diode, therefore the output time of high voltage level of ST is reduced, so is energy consumption. The connection of the second diode can prevent the signal outputted from the previous-stage shift registration unit from directly flowing to the control terminal of the thin film transistor which the following-stage shift registration unit corresponds, when the previous-stage shift registration unit is triggered, to avoid T0-Tn outputting sub-clock signals simultaneously, so that the sub-clock signal is not delayed. In addition, the first diode can prevent the signal from flowing to the first output terminal of the multi-stage shift registration unit, when the following-stage shift registration unit transmits the outputted signal to the control terminal of the thin film transistor to which a previous-stage shift registration unit or several previous-stage shift registration units corresponds.

Regarding the 3rd shift registration unit, for example, the second diode 42 can prevent the signal outputted from the shift registration unit FF2 from flowing to the control terminal of the thin film transistor to which the shift registration unit FF3-FFn corresponds, to avoid CLK3-CLKn outputting simultaneously. The first diode 33 can prevent the signal outputted from the shift registration unit FF2 from flowing to the first output terminal of the shift registration unit FF1-FF2.

Preferably, the first output terminal of the Nth shift registration unit is connected to the first input terminal of the 1st shift registration unit through the third diode, the anode of the third diode is connected to the first input terminal of the Nth shift registration unit, and the cathode of the third diode is connected to the first input terminal of the 1st shift registration unit.

For example, the first output terminal 46 of the last shift registration unit FFn is connected to the first input terminal 22 of the 1st shift registration unit FF0, the anode of the third diode 47 is connected to the first input terminal 46 of the last shift registration unit FFn, and the cathode of the third diode 47 is connected to the first input terminal 22 of the 1st shift registration unit FF0.

By transmitting the output signal of the last shift registration unit to the first input terminal of the 1st shift registration unit, the output time of the multi-channel sub-clock signal generated from the multi-phase clock generating circuit can be extended.

Figure 4:
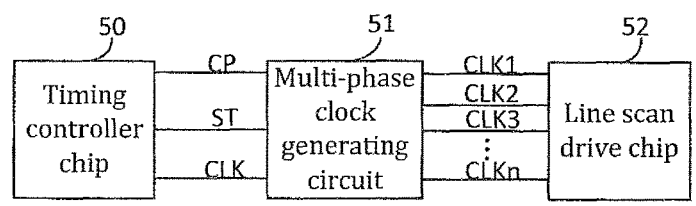
FIG. 4 is a diagram illustrating the connection of the timing controller chip and a multi-phase clock generating circuit according to the present invention.

As shown in FIG. 4, the timing controller chip 50 is only required to output three signals to the multi-phase clock generating circuit 51, the multi-phase clock generating circuit 51 can generate a multi-channel clock signal CLK1-CLKn to the line scan drive chip 52, and the number of pins of the timing controller chip 50 and multi-phase clock generating circuit 51 is reduced. As the existing multi-phase clock generating circuit needs multi-channel clock signals to be inputted, and has a higher production cost, it can be seen by comparison that since the multi-phase clock generating circuit of the present invention only requires one clock signal to be inputted, through the control of the delay control signal, it is possible to form a plurality of phase clocks, and reduce the pins of the corresponding chip, thereby reducing production cost.

Figure 3:
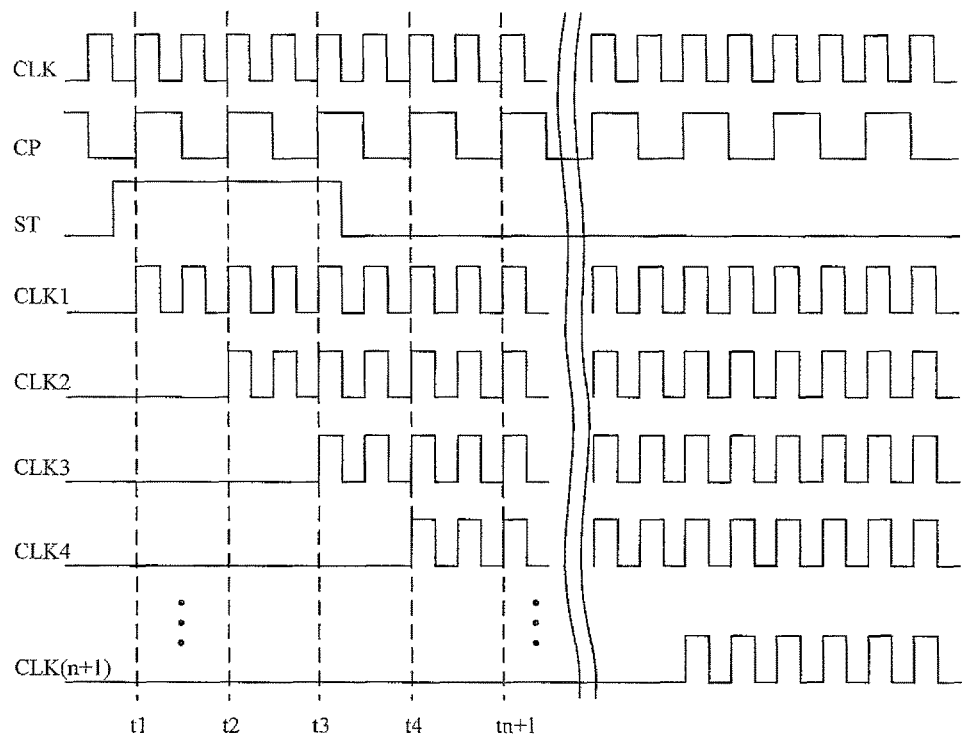
FIG. 3 is a diagram of the timing the of control signal of the multi-phase clock generating circuit according to the present invention.

The multi-phase clock generating circuit of the present invention works as follows: as shown in FIG. 3, when the ST is a high voltage level, and the CP signal is rising, FF0 is triggered, FF0 outputs a high pulse, the thin film transistor T0 is closed, signal CLK is thus through the output terminal of T0 to output CLK1; when signal CP arrives the second rising edge, FF1 is triggered, FF0 transmits the signal of ST to FF1.

For example, ST is a high voltage level, and at the time t1, signal CP arrives the first rising edge, FF0 is thus triggered, FF0 outputs a high pulse, the thin film transistor T0 is closed, signal CLK is thus through the output terminal of T0 to output CLK1; at time t2, signal CP arrives the second rising, FF1 is thus triggered, FF1 outputs a high pulse, the thin film transistor T1 is closed, due to the control terminal the thin film transistor T0 being connected to the output terminal of FF1, the film transistor T0 will therefore be closed, signal CLK is thus through the output terminal of T0 to output CLK1 and through the output terminal of T1 to output CLK2; at time t3, signal CP arrives the third rising, FF2 is thus triggered, FF2 outputs a high pulse, the thin film transistor T2 is closed, due to the control terminals the thin film transistors T0, T1 are connected to the output terminal of FF2, therefore the thin film transistors T0, T1 are closed, signal CLK is thus through the output terminal of T0 to output CLK1, through the output terminal of T1 to output CLK2, and through the output terminal of T2 to output CLK3; at time t4, signal CP arrives the fourth rising, FF3 is thus triggered, FF3 outputs a high pulse, the thin film transistor T3 is closed, due to the control terminals the thin film transistors T0, T1, T2 are connected to the output terminal of FF3, therefore the thin film transistors T0, T1, T2 are closed, signal CLK is thus through the output terminal of T0 to output CLK1, through the output terminal of T1 to output CLK2, through the output terminal of T2 to output CLK3, and through the output terminal of T3 to output CLK4; at time tn+1, signal CP arrives the nth rising, FFn is thus triggered, FFn outputs a high pulse, the thin film transistor Tn is closed, due to the control terminals the thin film transistors Tn−1, and Tn−2 to T0 are connected to the output terminal of FFn, therefore the thin film transistors T0, T1, Tn−1 to T0 are closed, signal CLK is thus through the output terminals of T0-Tn to output CLK1-CLKn+1.

Preferably, a phase difference between a nth sub-clock signal and a (n+1)th sub-clock is determined according to a period of the delay control signal. That is, CLK1, CLK2 . . . CLKn sequentially output a CLK signal, the phase difference there-between can be controlled by the period of the signal CP, and when the period of CP is larger, the corresponding phase difference between the clock signals is greater. For example, as shown in FIG. 2, the phase difference between CLK1 and CLK2 is equal to t2−t1, the period of CP.

Preferably, an output time of a high voltage level of an activation control signal determines an output time of the multi-channel sub-clock signals. The output time of a high voltage level of the signal ST can control the output time of the signal CLK (that is, when to output CLK1-CLKn) through each channel, the percentage of signal ST is larger, the output time of CLK through each channel is longer.

According to the principle of D trigger, when signal ST arrives the rising edge, signal CP arrives the rising edge, the output terminal of D trigger outputs a high voltage level until ST is low, and when CP arrives at the next rising edge, the output terminal of D trigger outputs a low voltage level, the thin film transistor is thus off and no longer outputs the corresponding sub-clock signal.

Therefore, the output time of the high voltage level of signal ST is longer, then the output time of the high voltage level of D trigger is also longer, and CLK output time for each channel can also be longer. Thus the percentage of signal ST is larger, the output time of the high voltage level of the output terminal of D trigger is also longer, the output time of CLK through each channel is longer.

The multi-phase clock generating circuit and the liquid crystal display device of the present invention, by improving the existing clock generating circuit, generates the multi-channel clock with phase difference from only one-channel clock signal being inputted, thus reduces the number of pins of the timing control chip and power management chip, and also reduces production cost.

The present invention further provides a liquid crystal display panel, which comprises a plurality of data lines and a plurality of scan lines, and a plurality of primitive cells limited by the data lines and the scan lines; and a line scan drive chip for providing a scan signal to the scan lines; the scanning signal generated according to multi-channel sub-clock signals of the multi-phase clock generating circuit; wherein the multi-phase clock generating circuit comprises:

a shift register including N shift registration units, which are cascaded with each other; each shift registration unit having a first input terminal, a second input terminal, and a first output terminal, the first input terminal being inputted with an activation control signal, the activation control signal used for controlling an activation of a shift register; the second input terminal being inputted with a delay control signal, the delay control signal for controlling outputting of the shift registration unit, the first output terminal of an nth shift registration unit connected to the first input terminal of an (n+1)th shift registration unit, wherein N≥2, 1≤n≤N; and a thin film transistor set including N thin film transistors, each of the thin film transistors corresponding to one of the shift registration units; each of the thin film transistors having a third input terminal, a control terminal, a second output terminal; a third input terminal of each of the thin film transistors being inputted with a main clock signal serving as a reference clock; the second clock signal output terminal of each of the thin film transistors outputting a sub-clock signal, which is inputted to line scan drive chip of the display panel; wherein the control terminals of the thin film transistors of a nth stage are respectively connected to the first output terminals of an (N−n+1) shift registration units.

Preferably, the multi-phase clock generating circuit further comprises a first diode set including N first diodes, each of the first diodes corresponding to each of the shift registration units;

an anode of the first diodes connected to the first output terminal of the shift registration unit, a cathode of the first diodes connected to the control terminal of the thin film transistor.

Preferably, the multi-phase clock generating circuit further comprises a second diode set including N−1 second diodes, each two adjacent shift registration units being connected to each other through the second diode; a cathode of an nth second diode connected to a cathode of the first diode of an nth shift registration unit, anode of an nth second diode connected to a cathode of the first diode of an (n+1)th shift registration unit.

Preferably, a phase difference between an nth sub-clock signal and an (n+1)th sub-clock is determined according to a period of the delay control signal.

Preferably, an output time of a high voltage level of an activation control signal determines an output time of the multi-channel sub-clock signals.

Preferably, the first output terminal of the Nth shift registration unit is connected to the first input terminal of the 1st shift bit storage through a third diode, an anode of the third diode is connected to the first output terminal of the Nth shift registration unit; a cathode of the third diode is connected to the first input terminal of the 1st shift registration unit.

The liquid crystal display panel may include any of the above multi-phase clock generating circuits, in view of the detailed description of the existing multi-phase clock generating circuit in the above, there is no further description here.

The multi-phase clock generating circuit and the liquid crystal display device of the present invention, by improving the existing clock generating circuit, makes the multi-channel clock with phase difference generate from only one-channel clock signal being inputted, thus reducing the number of pins of the timing control chip and power management chip, and also reducing production cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-phase clock generating circuit, comprising:
a shift register including N shift registration units, which are cascaded with each other, each shift registration unit having a first input terminal, a second input terminal, and a first output terminal, said first input terminal being inputted with an activation control signal for controlling activation of said shift register, said second input terminal being inputted a delay control signal for controlling outputting of said shift registration unit, said first output terminal of an nth shift registration unit being connected to said first input terminal of an (n+1)th shift registration unit, where N≥2, 1≤n≤N; and
a thin film transistor set including N thin film transistors, each of said thin film transistors corresponding to one of said shift registration units, each of said thin film transistors having a third input terminal, a control terminal, and a second output terminal, said third input terminal of each of said thin film transistors being inputted with a main clock signal serving as a reference clock, said second output terminal of each of said thin film transistors outputting a sub-clock signal, which is inputted to a line scan drive chip of a display panel, wherein said control terminals of said thin film transistors of a nth stage are respectively connected to said first output terminals of (N−n+1) shift registration units;
a first diode set including N first diodes, each of said first diodes corresponding to each of said shift registration units; an anode of said first diodes connected to said first output terminal of said shift registration unit, a cathode of said first diodes connected to said control terminal of said thin film transistor;
a second diode set including N−1 second diodes, each two adjacent shift registration units being connected to each other through a second diode; a cathode of an nth second diode connected to a cathode of said first diode of said nth shift registration unit, an anode of said nth second diode connected to a cathode of said first diode of said (n+1)th shift registration unit;
wherein said phase difference between a nth sub-clock signal and a (n+1)th sub-clock is determined according to a period of said delay control signal.

2. The multi-phase clock generating circuit according to claim 1, wherein an output time of said multi-channel sub-clock signals is determined according to said output time of a high voltage level of said activation control signal.

3. The multi-phase clock generating circuit according to claim 1, wherein said first output terminal of said Nth shift registration unit is connected to said first input terminal of said 1st shift bit storage through a third diode, an anode of said third diode is connected to said first output terminal of said Nth shift registration unit; a cathode of said third diode is connected to said first input terminal of said 1st shift registration unit.

4. A multi-phase clock generating circuit, comprising:
a shift register including N shift registration units, which are cascaded with each other; each shift registration unit having a first input terminal, a second input terminal, and a first output terminal, said first input terminal being inputted with an activation control signal, said activation control signal being used for controlling an activation of a shift register; said second input terminal being inputted with a delay control signal, said delay control signal for controlling outputting of said shift registration unit, said first output terminal of an nth shift registration unit connected to said first input terminal of an (n+1)th shift registration unit, wherein N≥2, 1≤n≤N; and
a thin film transistor set including N thin film transistors, each of said thin film transistors corresponding to one of said shift registration units, each of said thin film transistors having a third input terminal, a control terminal, and a second output terminal; said third input terminal of each of said thin film transistors being inputted with a main clock signal serving as a reference clock; said second clock signal output terminal of each of said thin film transistors outputting a sub-clock signal, which is inputted to a line scan drive chip of a display panel; wherein said control terminals of said thin film transistors of a nth stage are respectively connected to said first output terminals of (N−n+1) shift registration units.

5. The multi-phase clock generating circuit according to claim 4, wherein said multi-phase clock generating circuit further comprises:
a first diode set including N first diodes, each of said first diodes corresponding to each of said shift registration units;
an anode of said first diode connected to said first output terminal of said shift registration unit, a cathode of said first diode connected to said control terminal of said thin film transistor.

6. The multi-phase clock generating circuit according to claim 5, wherein said multi-phase clock generating circuit further comprises:
a second diode set including N−1 second diodes, each two adjacent shift registration units being connected to each other through said second diode;
a cathode of said nth second diode connected to a cathode of said first diode of said nth shift registration unit, an anode of said nth second diode connected to a cathode of said first diode of said (n+1)th shift registration unit.

7. The multi-phase clock generating circuit according to claim 4, wherein said phase difference between an nth sub-clock signal and an (n+1)th sub-clock is determined according to a period of said delay control signal.

8. The multi-phase clock generating circuit according to claim 4, wherein said output time of a high voltage level of said activation control signal determines an output time of said multi-channel sub-clock signals.

9. The multi-phase clock generating circuit according to claim 4, wherein said first output terminal of said Nth shift registration unit is connected to said first input terminal of said 1st shift bit storage through a diode, an anode of said diode is connected to said first output terminal of said Nth shift registration unit; a cathode of said diode is connected to said first input terminal of said 1st shift registration unit.

10. A liquid crystal display panel, comprising:
a plurality of data lines and a plurality of scan lines, and a plurality of primitive cells limited by said data lines and said scan lines; and
a line scan drive chip for providing a scan signal to said scan lines; said scanning signal being generated according to multi-channel sub-clock signals of said multi-phase clock generating circuit;
wherein said multi-phase clock generating circuit comprises:
a shift register including N shift registration units, which are cascaded with each other; each shift registration unit having a first input terminal, a second input terminal, and a first output terminal, said first input terminal being inputted with an activation control signal, said activation control signal being used for controlling an activation of a shift register; said second input terminal being inputted with a delay control signal, said delay control signal for controlling outputting of said shift registration unit, said first output terminal of an nth shift registration unit connected to said first input terminal of an (n+1)th shift registration unit, wherein N>2, 1<n<N; and
a thin film transistor set including N thin film transistors, each of said thin film transistors corresponding to one of said shift registration units, each of said thin film transistors having a third input terminal, a control terminal, and a second output terminal; said third input terminal of each of said thin film transistors being inputted with a main clock signal, said main clock signal being used for providing a reference clock; said second clock signal output terminal of each of said thin film transistors outputting a sub-clock signal, which is inputted to the line scan drive chip of a display panel; wherein said control terminals of said thin film transistors of a nth stage are respectively connected to said first output terminals of (N−n+1) shift registration units.

11. The liquid crystal display panel according to claim 10, wherein said multi-phase clock generating circuit further comprises:
a first diode set including N first diodes, each of said first diodes corresponding to each of said shift registration units;
an anode of said first diodes connected to said first output terminal of said shift registration unit, a cathode of said first diode connected to said control terminal of said thin film transistor.

12. The liquid crystal display panel according to claim 11, wherein said multi-phase clock generating circuit further comprises:
a second diode set including N−1 second diodes, each two adjacent shift registration units being connected to each other through said second diode;
a cathode of an nth second diode connected to a cathode of said first diode of an nth shift registration unit, an anode of an nth second diode connected to a cathode of said first diode of an (n+1)th shift registration unit.

13. The liquid crystal display panel according to claim 10, wherein said phase difference between an nth sub-clock signal and an (n+1)th sub-clock is determined according to a period of said delay control signal.

14. The liquid crystal display panel according to claim 10, wherein said output time of a high voltage level of said activation control signal determines an output time of said multi-channel sub-clock signals.

15. The liquid crystal display panel according to claim 10, wherein said first output terminal of said Nth shift registration unit is connected to said first input terminal of said 1st shift bit storage through a diode, an anode of said diode is connected to said first output terminal of said Nth shift registration unit; a cathode of said diode is connected to said first input terminal of said 1st shift registration unit.

* * * * *